United States Patent [19]

Anazawa et al.

[11] 3,908,184

[45] Sept. 23, 1975

[54] CERAMIC SUBSTRATE ASSEMBLY FOR ELECTRONIC CIRCUITS HAVING CERAMIC FILMS THEREON FOR INTERCEPTING THE FLOW OF BRAZING AGENTS

[75] Inventors: Shinzo Anazawa, Tokyo; Toshiro Kuroda, Nagoya, both of Japan

[73] Assignee: Nippon Electric Company Limited, Tokyo, Japan

[22] Filed: Jan. 25, 1974

[21] Appl. No.: 436,801

[30] Foreign Application Priority Data

Jan. 30, 1973 Japan ............................... 48-12285

[52] U.S. Cl. ...................... 357/72; 357/73; 357/74; 357/75; 357/80; 174/52 S

[51] Int. Cl.$^2$......................................... H01L 23/28

[58] Field of Search ............ 317/234, 3, 4, 4.1, 5.4; 174/52 S

[56] References Cited

UNITED STATES PATENTS

| | | | |
|---|---|---|---|
| 3,192,307 | 6/1965 | Lazar | 317/234 G |
| 3,405,224 | 10/1968 | Yawata et al. | 317/234 G |
| 3,555,364 | 1/1971 | Matcovich | 317/234 H |
| 3,735,211 | 5/1973 | Kapnias | 317/234 E |
| 3,739,232 | 6/1973 | Grossman et al. | 317/234 H |
| 3,748,543 | 7/1973 | Roberson | 317/234 G |
| 3,760,090 | 9/1973 | Fowler | 317/234 G |

OTHER PUBLICATIONS

IBM Technical Disclosure Bulletin; Joining Integrated Circiut Chips to Substrates; by Schmeckenbecher, Vol. 14, No. 1, June 71.

*Primary Examiner*—Andrew J. James
*Attorney, Agent, or Firm*—Hopgood, Calimafde, Kalil, etc.

[57] ABSTRACT

A substrate assembly for electronic circuit elements is manufactured by forming conductive films on a ceramic substrate. Prior to brazing an electronic circuit element to a first area of each of predetermined conductive films and to attaching a bond connected to the electronic circuit element to a second area of a different one of the predetermined conductive films, a ceramic paste is applied to the ceramic substrate to cover that portion of each of the predetermined conductive films which lies between the first and the second areas. The ceramic paste is subsequently sintered into a ceramic film covering the ceramic substrate and the above-mentioned portions.

7 Claims, 7 Drawing Figures

CERAMIC SUBSTRATE ASSEMBLY FOR ELECTRONIC CIRCUITS HAVING CERAMIC FILMS THEREON FOR INTERCEPTING THE FLOW OF BRAZING AGENTS

BACKGROUND OF THE INVENTION

This invention relates to a ceramic substrate assembly for electronic circuit elements, such as transistors, passive circuit elements, and luminescent diodes, and a method of manufacturing an electronic circuit element assembly which may be a hybrid integrated circuit or a luminescent display unit.

In an electronic circuit element assembly comprising a ceramic substrate, a plurality of conductive films formed on the substrate, and a plurality of electronic circuit elements brazed to the conductive films, it has been problems to intercept unwanted or undesired flow of the brazing agent and to protect the conductive films against corrosion. For example, the undesired flow of the brazing agent along a conductive film during brazing of a luminescent diode to a conductive film in the manufacture of a luminescent display unit makes it often impossible to attach to the conductive film a bond connected to a luminescent diode brazed to a different one of the conductive films. In a thick layer hybrid, it is the practice to dispose a solder layer on each of the conductive films to protect them, to reduce the electric resistance of each conductive film, and to fix passive circuit elements to the substrate assembly. The solder layers are formed by applying precoatings to the semiconductor active circuit elements and the bonds attached thereto and to the conductive films and then dipping the assembly in a solder bath. If the time of dipping is too long, the solder undesirably flows beneath the precoatings to the areas of attachment of the bonds to the conductive films thereby damaging the attachment. Conventional countermeasures for the undesired flow of the brazing agent are either to strictly control the amount, the time of heating, and the temperature of the brazing agent or to form means on each conductive film for intercepting the unwanted flow. The use of the brazing agent intercepting means, however, has been a mere suggestion because it has been impossible to find a suitable material therefor capable of withstanding the thermal and chemical attack of the brazing agent. On the other hand, solder tends to corrode the conductive films rather than protect them. Although it is possible to protect the resistor elements in thick film hybrids with a resin or glass mass, application of a resin mass to protect the conductive films is disadvantagous because resins are not only weak against chemical corrosion but also show considerably different thermal expansion as compared with the ceramic substrate to give rise to peeling off of the conductive films from the substrate and to racks in the resin mass particularly when the resin mass is brought into contact with the substrate at a wide area. In contrast, glass of high softening points is resistive to chemical corrosion and exhibits small thermal expansion. Application of a glass mass is, however, also objectionable because the high temperature required to form the glass mass raises the resistance of the conductive films and uncontrollably varies the resistance of the resistor elements in hybrids.

For a luminescent display unit, it is very desirable that the luminescent areas are in marked color contrast to the background. Although there are conventional luminescent display units comprising black ceramic substrates with a view to raising the contrast, the conductive films do not have a dark color. As a result, the contrast between the luminescing diodes and the surrounding portions of the conductive films is still insufficient.

SUMMARY OF THE INVENTION

It is therefore an object of the present invention to provide a ceramic substrate assembly for electronic circuit elements and a method of manufacturing an electronic circuit element assembly comprising such a substrate assembly, wherein the problems of the undesired flow of the brazing agent and the protection of the conductive films are both solved.

It is another object of this invention to provide a ceramic substrate assembly and a method of the kind described for solving the problem of the undesired flow of the solder.

It is a subordinate object of this invention to provide a ceramic substrate assembly for luminescent diodes, wherein the contrast between the luminescing diodes and the background is improved.

In the manner known in the art, a substrate assembly for electronic circuit elements according to this invention includes a ceramic substrate and a plurality of conductive films formed on the ceramic substrate. Each of the predetermined conductive films has a first area onto which one of the electronic circuit elements is to be brazed by the use of a brazing agent. Each of the predetermined conductive films has also a second area to which a bond connected to one of the electronic circuit elements brazed onto a different one of the conductive films is to be attached. In accordance with this invention, at least one ceramic film is formed integral with the ceramic substrate of the substantially same material as the ceramic substrate so as to cover that portion of each of the predetermined conductive films which lies between the first and the second areas. During brazing of the electronic circuit elements to the respective first areas of the predetermined conductive films, the ceramic film serves to intercept undesired flow of the brazing agent from the first areas to the second areas without requiring strict control of the amount, the time of heating, and the temperature of the brazing agent.

The substrate assembly may also comprise second predetermined conductive films, each having a third area on which a solder layer is to be formed and a fourth area to which a bond connected to one of the electronic circuit elements brazed onto a different one of the conductive films is to be attached. In accordance with an aspect of this invention, the ceramic film is made to further cover that portion of each of the second predetermined conductive films which lies between the third and the fourth areas. During soldering, the ceramic film serves to intercept undesired flow of the solder from the third areas to the fourth areas. Some or all of the second predetermined conductive films may be the same as the predetermined conductive films mentioned in the next preceding paragraph.

In case some or all of the electronic circuit elements are luminescent diodes, the ceramic film employed to intercept the undesired flow of the braze or solder should be a dark color.

Inasmuch as the ceramic film is made integral with the ceramic substrate of the substantially same material as the ceramic substrate, it is possible with this invention to protect the conductive films thermally, chemically, and mechanically. In addition, it is possible to reduce the undesirable chances of peeling off of the conductive films and occurrence of cracks in the protective means.

DESCRIPTION OF THE PREFERRED EMBODIMENTS

Figure 1:
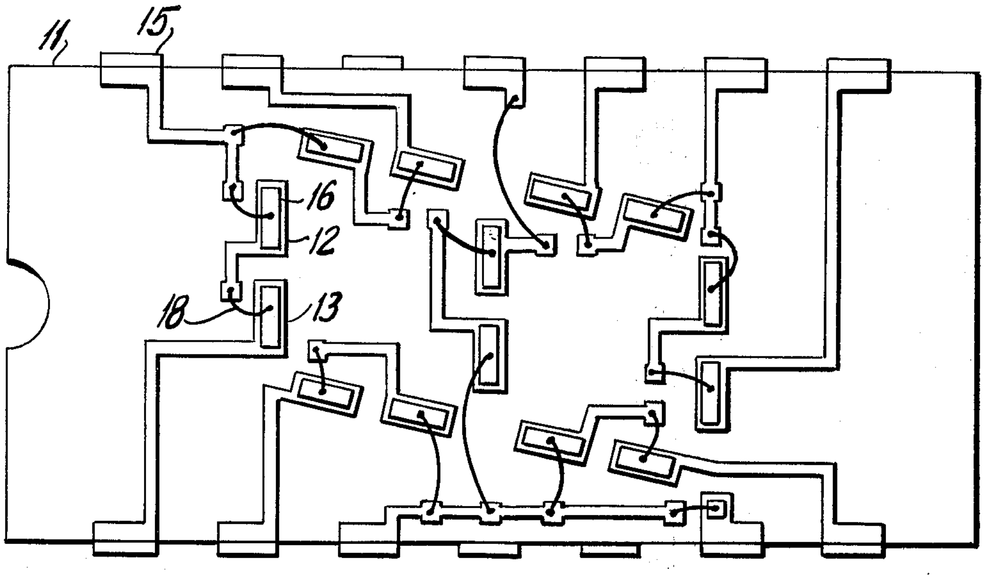
(PRIOR ART) FIG. 1
FIG. 1 is a schematic front view of a conventional luminescent display unit.
Figure 2:
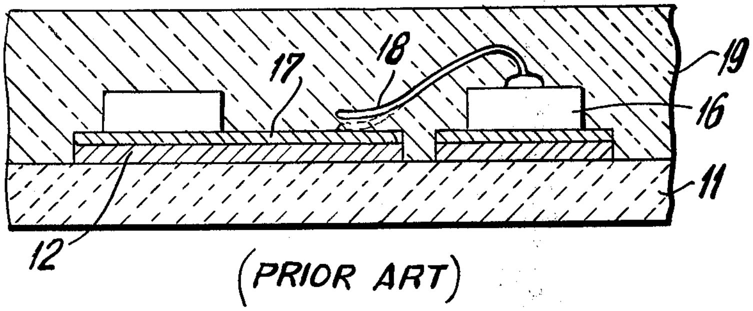
(PRIOR ART) FIG. 2
FIG. 2 is an illustrative cross-sectional view of the conventional luminescent display unit.

Referring to FIGS. 1 and 2, a conventional luminescent display unit comprises a ceramic substrate 11, a plurality of predetermined conductive films 12, and other conductive films 13. The substrate 11 has a plurality of terminals 15. Each of the predetermined conductive films 12 has a first area onto which a luminescent diode 16 is brazed by the use of a brazing agent 17. A bond 18 is attached to some of the luminescent diodes 16. Each of the predetermined conductive films 12 has a second area to which a bond 18 connected to a luminescent diode 16 brazed onto a different one of the predetermined or other conductive films 12 or 13 is attached. The bond 18 provides a series electric connection either between two luminescent diodes 16 or between a luminescent diode 16 and one of the other conductive films 13. In the example being illustrated, some of the other conductive films 13 are brought into electric connection with some of the terminals 15. As described in the preamble of the instant specification and best shown in FIG. 2, the brazing agent 17 tends undesirably to flow from the first areas to the second areas to render it practically impossible to attach the bonds 18 to the respective second areas. The luminescent display unit further comprises a transparent resin or glass coating 19 for protecting the conductive films 12 and 13 and the luminescent diodes 16. As described in the preamble of this specification, the protective coating 19 is insufficient and even defective. In addition, the contrast between the luminescing diodes and the background is insufficient because of the relatively light color of the conductive films 12 and 13.

Figure 3:
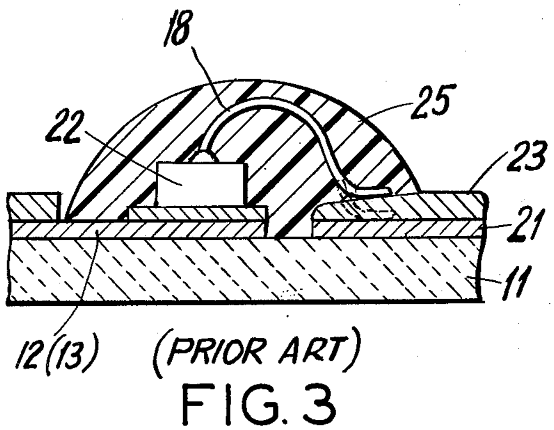
(PRIOR ART) FIG. 3
FIG. 3 is a similar cross-sectional view of a conventional thick film hybrid.

Referring to FIG. 3, a conventional thick film hybrid comprises a ceramic substrate 11, a plurality of second predetermined conductive films 21, and other conductive films 13. The thick film hybrid may further comprise the first predetermined conductive films 12 illustrated with reference to FIGS. 1 and 2. Here, a transistor 22 having a bond 18 connected thereto is brazed onto an area of one of the conductive films 12, 13, or 21 by the use of a brazing agent 17. Each of the second predetermined conductive films 21 has a third area on which a solder layer 23 is to be disposed and a fourth area to which a bond 18 connected to the electronic circuit element, such as 22, brazed onto a different one of the conductive films 12, 13, or 21 is attached. Resistor elements and capacitive elements (not shown) are mounted on the substrate 11 with their leads put into through holes (not shown) formed through preselected ones of the conductive films 12, 13, and/or 21 and the substrate 11. After the semiconductor active circuit elements, such as 22, are covered with precoatings 25, the assembly is dipped in a bath of molten solder. As described in the preamble of this specification and schematically illustrated in FIG. 3, the solder 23 tends to undesirably flow beneath the precoatings 25 from the third areas to the fourth areas.

Figure 4:
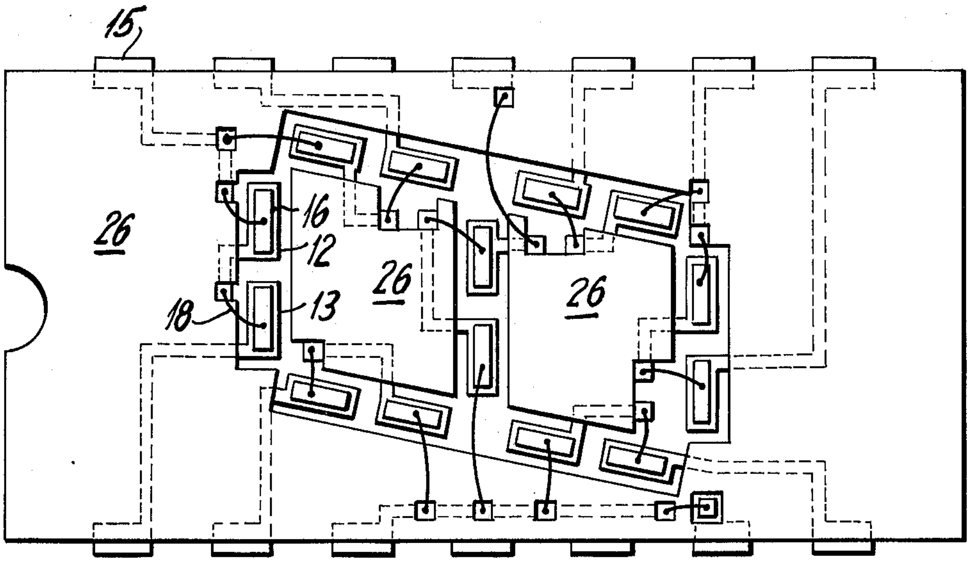
FIG. 4 is a schematic front view of a luminescent display unit according to the instant invention.
Figure 5:
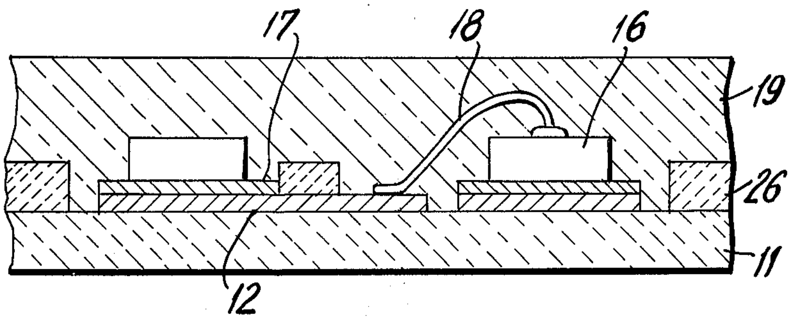
FIG. 5 is an illustrative cross-sectional view of the luminescent display unit depicted in FIG. 4.

Referring now to FIGS. 4 and 5, a luminescent display unit according to the present invention comprises parts designated with like reference numerals as in FIGS. 1 and 2. It should be noted that a substrate assembly for the luminescent display unit is manufactured in accordance with this invention by applying, prior to brazing of the luminescent diodes 16 to the conductive films 12 and 13, a ceramic paste to that principal surface of the substrate 11 on which the conductive films 12 and 13 are formed, except the first areas, the second areas, and those areas of the other conductive films 13 to which the bonds 18 are to be attached. The ceramic paste should include ceramic powder of the substantially same material as the substrate 11 is made of. The coating of the ceramic paste is preferably from 0.01 mm to 0.3 mm in thickness. The ceramic paste is sintered to become a ceramic film 26 that is integral with the substrate 11 and covers at least that portion of each of the predetermined conductive films 12 which lies between the first and second areas. The ceramic film 26 is given a dark appearance by adding a coloring constituent to the ceramic paste, which may either be an oxide of iron, nickel, manganese, chromium, cobalt, or titanium or may be molybdic acid, tungstic acid, a molybdate, a tungstate, or a mixture of any combination of these compounds as described in Japanese Pat. Application No. 47-30997.

It will readily be understood that a like ceramic film serves to intercept the undesired flow of solder if formed integral with the substrate of the substantially same material as the substrate to cover that portion of each of the second predetermined conductive films illustrated with reference to FIG. 3 which lies between the third and fourth areas.

By way of example, a pattern of the conductive films 12, 13, and/or 21 is printed on one of the principal surfaces of a 1.5 mm thick unsintered alumina green tape with a past including tungsten powder. A ceramic paste including alumina powder is applied to the principal surface of the green tape in a thickness of about 40 microns by resorting to the printing techniques. The assembly is heated to a temperature between 1,600°C and 1,700°C in a hydrogen atmosphere to metallize the tungsten paste and sinter the green tape and ceramic paste, thereby providing a substrate assembly for electronic circuit elements according to this invention.

In case the green tape is made of an alumina ceramic material including alumina in an amount 94 percent, the film 26 may be formed in accordance with an example given in the referenced Japanese patent application as follows. Namely, a paste is provided by kneading 98 percent of alumina ceramic material powder and 2 percent of ammonium molybdate with butyl carbitol including 8 percent nitrocellulose. The paste is screen-printed on the green tape having the conductive film pattern printed thereon. After drying, the resulting sheet is co-fired at 1,600°C for one hour in a stream of hydrogen made to effervesce through water. The substrate 11 may be of steatite, forsterite, a beryllia ceramic material, a zircon ceramic material, or a mullite ceramic material. The additive may be lithium molybdate, calcium tungstate, or manganese tungstate. In case the amount of the additive is less than 0.1 percent, the film is not dark enough. The additive, if used in excess of 20 percent, tends to increase the dielectric tangent of the film 26.

Figure 6:
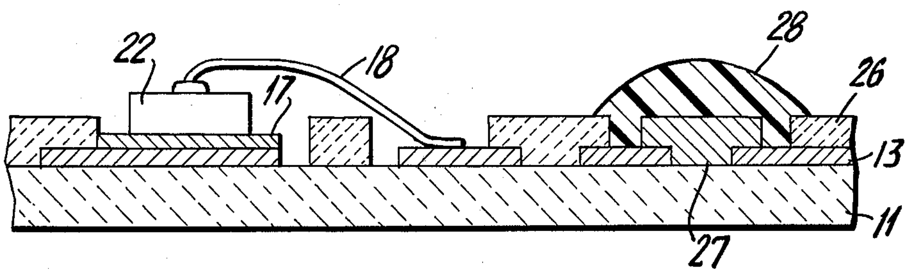
FIG. 6 is a similar cross-sectional view of a thick film hybrid according to this invention.

Referring to FIG. 6, a thick film hybrid comprises a ceramic substrate 11, a plurality of conductive films 13, a semiconductor active circuit element 22, and a passive circuit element 27. According to this invention, a ceramic film 26 formed integral with the substrate 11 of the substantially same material as the substrate 11 covers those portions of the conductive films 13 on which the semiconductor active circuit element 22 is brazed with a brazing agent 17, a bond 18 is attached, and the passive circuit element 27 is mounted. The passive circuit element 27 is covered with a protective resin mass 28.

Figure 7:
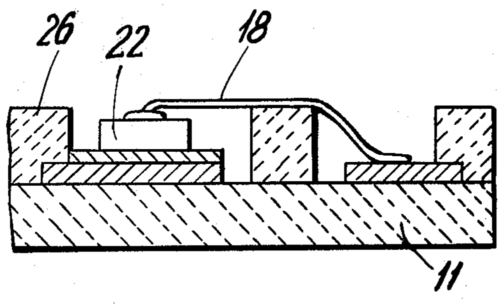
FIG. 7 is a similar cross-sectional view of an electronic circuit element assembly according to this invention.

Referring finally to FIG. 7, an electric circuit element assembly comprises parts designated with like reference numerals as in FIGS. 4, 5, and 6. Here, the thickness of the ceramic film 26 is substantially equal to the height of the active circuit element, such as 22, having bonds 18 attached thereto. This reduces the fear of the bonds 18 coming into undesired electric contact with the same conductive film on which the circuit element having the bond is brazed.

What is claimed is:

1. In a substrate assembly for electronic circuit elements comprising a ceramic substrate having a plurality of conductive films formed thereon, each of a selected conductive film of said plurality having a first area on which one of said electronic circuit element is brazed by means of a brazing agent and a second area to which a bond connected to one of said electric circuit elements brazed on a different conductive film is attached, the improvement which comprises, at least one ceramic film formed integral with said ceramic substrate of substantially the same material as said ceramic substrate, said integral ceramic film being disposed on said substrate so as to cover that portion of each of said predetermined conductive film which lies between said first area and said second area to intercept any undesired flow of said brazing agent from said first area to said second area.

2. The substrate assembly of claim 1, including a first selected conductive film and a second selected conductive film in said plurality, said second conductive film having a third area on which a solder layer is disposed and a fourth area to which a bond is attached, said bond being in turn connected to one of said electronic circuit elements which is brazed onto a different one of said conductive films of said plurality, wherein said ceramic film further covers that portion of each of said second conductive film which lies between said third and fourth areas to intercept any undesired flow of solder from said third area to said fourth area.

3. The substrate assembly of claim 1, wherein preselected ones of said electronic circuit elements are luminescent diodes, and wherein at least a portion of said ceramic film is visible together with said luminescent diodes in the final assembly, and wherein said ceramic film has a dark contrasting color so as to provide improved color contrast between said luminescent diodes and said ceramic film when said diodes are caused to luminesce during use.

4. The substrate assembly of claim 3, wherein said ceramic film includes in its composition a coloring agent selected from the group consisting of molybdic acid, tungstic acid, molybdates and tungstates.

5. The substrate assembly of claim 1, wherein the thickness of said ceramic film on said substrate is approximately equal to the height of the electronic circuit elements in which said bonds are attached to said conductive films.

6. The substrate assembly of claim 2, including a third selected conductive film, said third conductive film in said plurality having a fifth area on which one of said electronic circuit elements is brazed by means of a brazing agent, wherein said ceramic film further covers that portion of a said ceramic substrate which lies between said fifth area and at least one of said first and second areas, thereby to intercept the flow of said brazing agent from said fifth area to at least one of said first and second areas.

7. The substrate assembly of claim 1, wherein preselected ones of said electronic circuit elements are luminescent, wherein at least a portion of said ceramic film is visible together with said luminescent electronic circuit elements in the final assembly, and wherein said ceramic film has a dark contrasting color so as to provide improved color contrast between said luminiscent electronic circuit elements and said ceramic film when said luminescent electronic circuit elements are caused to luminesce.

* * * * *

UNITED STATES PATENT OFFICE

CERTIFICATE OF CORRECTION

Patent No. 3,908,184 Dated September 23, 1975

Inventor(s) Shinzo Anazawa and Toshiro Kuroda

It is certified that error appears in the above-identified patent and that said Letters Patent are hereby corrected as shown below:

The assignee "Nippon Electric Company, Limited, Tokyo, Japan" should read --Nippon Electric Company Limited, Tokyo, Japan and Narumi China Corporation, Aichi, Japan.--

Signed and Sealed this

*twenty-third* Day of *March 1976*

[SEAL]

*Attest:*

RUTH C. MASON
*Attesting Officer*

C. MARSHALL DANN
*Commissioner of Patents and Trademarks*